US011056098B1

(12) United States Patent
Gejji

(10) Patent No.: US 11,056,098 B1
(45) Date of Patent: Jul. 6, 2021

(54) SILENT PHONEMES FOR TRACKING END OF SPEECH

(71) Applicant: Amazon Technologies, Inc., Seattle, WA (US)

(72) Inventor: Pushkaraksha Gejji, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 177 days.

(21) Appl. No.: 16/455,381

(22) Filed: Jun. 27, 2019

Related U.S. Application Data

(60) Provisional application No. 62/772,359, filed on Nov. 28, 2018.

(51) Int. Cl.
*G10L 15/05* (2013.01)
*G10L 25/87* (2013.01)
*G10L 25/78* (2013.01)

(52) U.S. Cl.
CPC .............. *G10L 15/05* (2013.01); *G10L 25/87* (2013.01); *G10L 2025/783* (2013.01)

(58) Field of Classification Search
CPC ......... G10L 15/05; G10L 25/87; G10L 15/02; G10L 15/063; G10L 15/16; G10L 25/27; G10L 15/1815; G10L 15/193; G10L 15/197; G10L 15/22; G10L 2015/0635; G10L 2015/088; G10L 25/30; G06N 3/0445; G06N 3/0454; G06N 3/0472; G06N 20/00; G06N 3/02; G06N 7/005; G06F 16/683; G06F 16/686; G06F 40/247; G06F 40/284; G06F 40/289

(Continued)

(56) References Cited

U.S. PATENT DOCUMENTS 5,740,318 A 4/1998 Naito et al.
7,403,930 B2 * 7/2008 Ho .................. G05B 13/027
257/E21.528

(Continued)

OTHER PUBLICATIONS

U.S. Appl. No. 16/455,400, "Hybrid Decoding Using Hardware and Software for Automatic Speech Recognition Systems," Filed Jun. 27, 2019.

(Continued)

*Primary Examiner* — Vijay B Chawan
(74) *Attorney, Agent, or Firm* — Kilpatrick Townsend & Stockton LLP

(57) ABSTRACT

Embodiments describe a method for speech endpoint detection including receiving identification data for a first state associated with a first frame of speech data from a WFST language model, determining that the first frame of the speech data includes silence data, incrementing a silence counter associated with the first state, copying a value of the silence counter of the first state to a corresponding silence counter field in a second state associated with the first state in an active state list, and determining that the value of the silence counter for the first state is above a silence threshold. The method further includes, determining that an endpoint of the speech has occurred in response to determining that the silence counter is above the silence threshold, and outputting text data representing a plurality of words determined from the speech data that was received prior to the endpoint.

20 Claims, 11 Drawing Sheets

(58) Field of Classification Search
USPC ....... 704/236, 248, 233, 253, 257, 240, 210, 704/215; 706/20

See application file for complete search history.

(56) References Cited

U.S. PATENT DOCUMENTS

| | | | |
|---|---|---|---|
| 8,972,243 B1 | 3/2015 | Strom et al. | |
| 9,396,722 B2* | 7/2016 | Chung | G10L 25/27 |
| 9,502,031 B2 | 11/2016 | Khan et al. | |
| 9,865,254 B1* | 1/2018 | Filimonov | G10L 15/1822 |
| 10,121,467 B1* | 11/2018 | Gandhe | G06F 40/284 |
| 10,121,471 B2 | 11/2018 | Hoffmeister et al. | |
| 10,134,425 B1 | 11/2018 | Johnson, Jr. | |
| 10,403,268 B2* | 9/2019 | Trawick | G10L 15/08 |
| 10,650,809 B2 | 5/2020 | Qian et al. | |
| 10,657,952 B2* | 5/2020 | Hofer | G10L 15/05 |
| 10,665,222 B2* | 5/2020 | Bang | G10L 25/03 |
| 2002/0184017 A1* | 12/2002 | Lee | G10L 25/87 704/236 |
| 2014/0379345 A1* | 12/2014 | Chung | G10L 25/27 704/248 |
| 2016/0093292 A1 | 3/2016 | Hofer et al. | |
| 2016/0379629 A1 | 12/2016 | Hofer et al. | |
| 2017/0323638 A1 | 11/2017 | Malinowski et al. | |
| 2018/0068653 A1* | 3/2018 | Trawick | G10L 15/142 |
| 2018/0121796 A1* | 5/2018 | Deisher | G06N 3/063 |
| 2019/0043476 A1* | 2/2019 | Hofer | G10L 15/05 |
| 2019/0043477 A1* | 2/2019 | Bang | G10L 25/03 |
| 2019/0129405 A1* | 5/2019 | Cella | H04B 17/309 |
| 2020/0126556 A1* | 4/2020 | Mosayyebpour | G06N 3/0445 |

OTHER PUBLICATIONS

U.S. Appl. No. 16/455,258, "Decompression and Compression of Neural Network Data Using Different Compression Schemes," Filed Jun. 27, 2019.

U.S. Appl. No. 16/455,334, "Neural Network Accelerator With Reconfigurable Memory," Filed Jun. 27, 2019.

U.S. Appl. No. 16/455,551, "Neural Network Accelerator With Compact Instruct Set," Filed Jun. 27, 2019.

U.S. Appl. No. 16/455,400, "Non-Final Office Action." dated Apr. 26, 2021, 18 pages.

* cited by examiner

| Active State List 420 | | | |
|---|---|---|---|
| State 1 | State Score 1 | | |
| ⋮ | ⋮ | | |
| State M | State Score M | | |
| Key 1 | | Source State 1 | Destination State 1 |
| ⋮ | | ⋮ | ⋮ |
| Key N | | Source State N | Destination State N |

FIG. 4B

| Word Lattice 422 | | | |
|---|---|---|---|
| Start State 1 | End State 1 | Output Label 1 | Word Score 1 |
| Start State 2 | End State 2 | Output Label 2 | Word Score 2 |
| ⋮ | ⋮ | ⋮ | ⋮ |
| Start State X | End State X | Output Label X | Word Score X |

FIG. 4C

| State 1 | State Score 1 | Silent_count 1 | Destination State 1 | | |
|---|---|---|---|---|---|
| ... | ... | ... | ... | | |
| State M | State Score M | Silent_count M | Destination State M | | |
| Key 1 | | | | Source State 1 | Destination State 1 |
| ... | | | | ... | ... |
| Key 2 | | | | Source State 2 | Destination State 2 |

Active State List 608

FIG. 6B

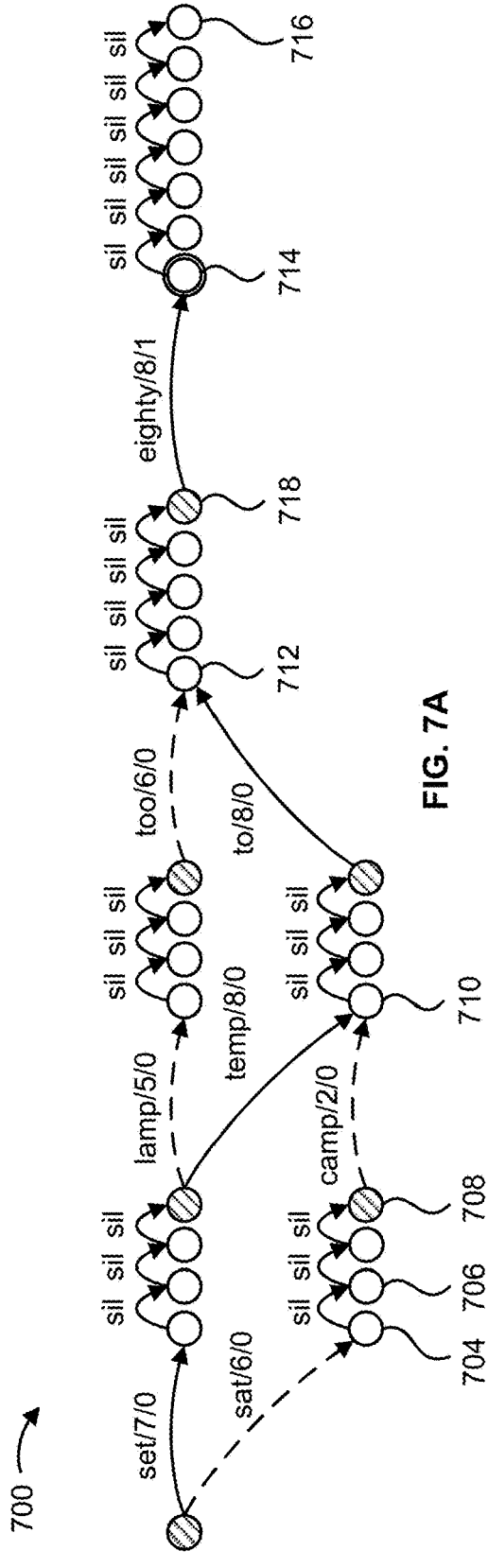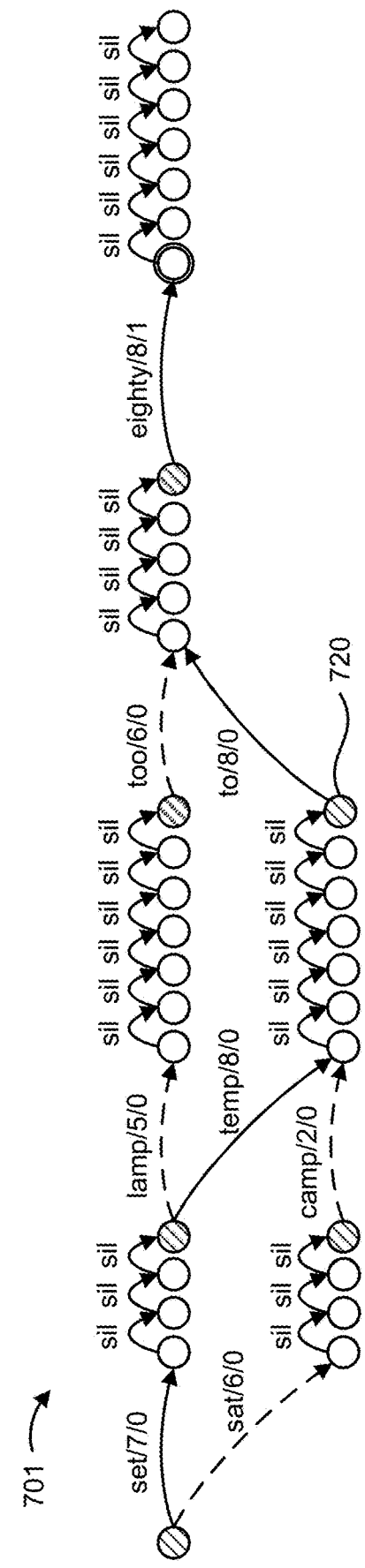
FIG. 7A
FIG. 7B

SILENT PHONEMES FOR TRACKING END OF SPEECH

CROSS-REFERENCES TO RELATED APPLICATIONS

This application claims the benefit of and priority to U.S. Provisional Application No. 62/772,359 filed Nov. 28, 2018, entitled "ACE Architecture—NNA." The contents of U.S. Provisional Application No. 62/772,359 are incorporated herein in their entirety for all purposes. The entire contents of U.S. Non-Provisional application Ser. No. 16/455,400, filed Jun. 27, 2019, titled "HYBRID DECODING USING HARDWARE AND SOFTWARE FOR AUTOMATIC SPEECH RECOGNITION SYSTEMS", are also incorporated herein by reference for all purposes.

BACKGROUND

Modern speech recognition systems enable humans to interact with computing devices solely based on spoken commands. Such systems employ techniques to identify the words spoken by a user based on the various qualities of a received audio input. Speech recognition systems enable speech-based user control of a computing device to perform tasks based on the user's spoken commands. Such a computing device includes computers, hand-held devices, telephone computer systems, kiosks, and a wide variety of other devices to improve human-computer interactions.

BRIEF DESCRIPTION OF THE DRAWINGS

Various embodiments in accordance with the present disclosure will be described with reference to the drawings, in which:

FIG. 4B illustrates an active state list stored with certain states and keys, according to some embodiments of the present disclosure;

FIG. 4C illustrates word lattice stored with certain words and scores, according to some embodiments of the present disclosure;

FIG. 6B illustrates an active state list configured with a silent counter field, according to some embodiments of the present disclosure;

FIGS. 7A-7B illustrate example graphs/word lattices outputted by a WFST accelerator that is being used to determine endpointing for speech saying "set temp to eighty," according to some embodiments of the present disclosure;

DETAILED DESCRIPTION

Figure 1:
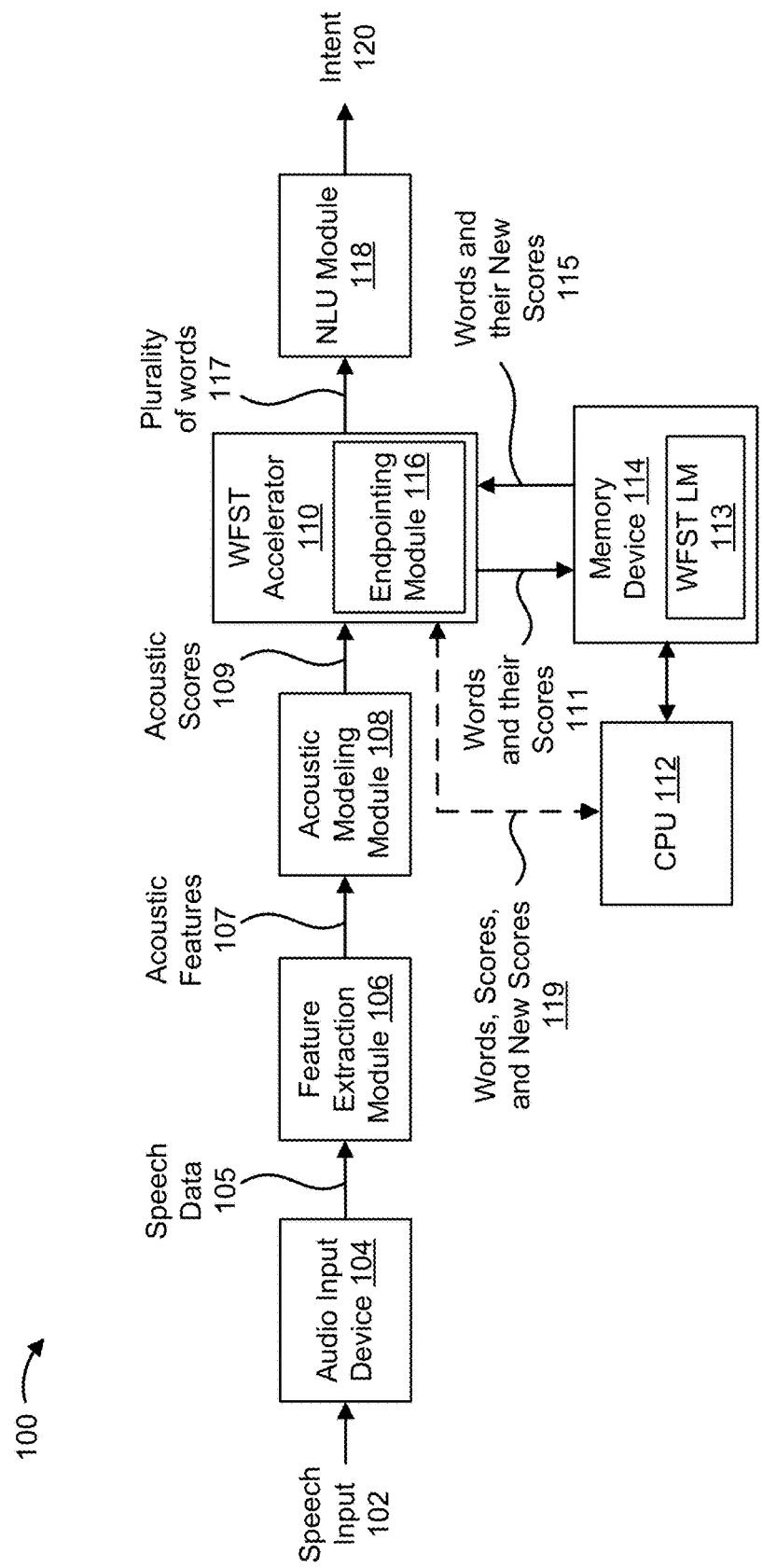
FIG. 1 illustrates a block diagram of an example operation of an ASR system configured for hybrid decoding, according to some embodiments of the present disclosure.

Automatic speech recognition (ASR) is a process of recognizing spoken language and translating the spoken language into its corresponding text. Typically a weighted finite state transducer (WFST) based model is used to translate the input audio to an output text. A finite state transducer is a finite state machine (FSM) that accepts an input label on a transition/arc and can also output an output label on the same arc. The input label can be identification data that identifies a specific state in the FSM. A weighted finite state transducer further adds a weighted score to each transition/arc. Such a WFST is able to translate various input labels into output labels according to the rules set within its states and transitions. Thus, this WFST takes as input acoustic units of the speech (like phones) and outputs the text of this speech in a cohesive sentence.

The WFST language model for ASR is typically split into several subsections that model the various intermediate steps needed to translate the spoken audio. For instance, a WFST model can include four different subsections: a Hidden Markov Model (HMM) subsection "H", a context model subsection "C", a lexicon model subsection "L", and a grammar model subsection "G." Once an acoustic model translates the spoken audio into phones, the HMM is used to convert the phones to tri-phones, the context model is then used to map a sequence of tri-phones to a single phoneme, the lexicon model is subsequently used to convert phonemes to words, and the grammar model is finally used to combine these words into sentences. Together, the four subsections (HCLG) form a complete WFST language model that can receive audio input and output a cohesive plurality of words determined based on the received audio input.

A phone represents a small acoustic component of spoken text that represents one of the standard sounds of a language. As the system only knows the audio observations of the spoken audio, it cannot know with absolute certainty the phones that correspond to these audio features. Instead, the system attempts to find the most likely text given the audio observations of the speech. Given that there may not be a large number of phones in a particular language (e.g., English is typically modeled with 40 phones), human speech patterns can vary greatly based on context, intonation, prosody, etc. Thus, the language model will typically account for these various factors to model speech more accurately. For example, HMMs typically model the phone in the context of its surrounding phones (e.g. a tri-phone model) as the pronunciation of a phone may differ based on the context that it is in. Furthermore, each phone is typically modeled with a beginning, middle, and end state. Thus, the number of states needed to model a complete set of phones in a language can easily reach into the thousands. This composition of these component WFSTs creates a very large WFST that has acoustic features as inputs and text as output. Thus, finding the most likely path within such a WFST in order to discover the most likely sequence of words given an audio sequence can easily become very computationally expensive.

Typical ASR systems decode the WFST using a distributed speech processing system. In such a system, local devices having one or more microphones can record sounds from a user speaking and convert those sounds into speech data. The speech data can then be sent to a downstream remote device for further processing, such as a server. The server, which can be especially suited for performing high volumes of complex calculations, can then decode the spoken sounds using the WFST model by a processor using a decoding algorithm, identify a command or intent based on the decoded sounds, and then send that command or intent back to the local device for execution.

As part of a distributed speech processing system, a local device may be configured to continuously send all detected audio to the remote device. Such communications however require significant bandwidth and networking resources. Furthermore, such communications require significant processing time for the large amount of data to be sent to the server, processed, and then sent back to the local device. Such communications also raise privacy concerns which may make it undesirable for a local device to send all captured audio to a remote device. A still further drawback is that a remote device may waste significant computing resources processing all incoming audio when no commands are being issued in the majority of the audio.

To determine when to stop processing audio data, a process called endpointing may be used. Traditional endpointing techniques typically rely on pauses detected in the audio data, however such techniques may be imprecise and may lead to errors, particularly when a user pauses speaking in mid-sentence, only to resume shortly thereafter. Current systems may determine an endpoint in the pause, thus resulting in cessation of speech processing at the incorrect time.

Common non-speech events and background noise in real-world signals complicate the endpoint detection problem considerably. For example, the endpoints of the speech are often obscured by various artifacts such as clicks, pops, heavy breathing, or dial tones. Similar types of artifacts and background noise may also be introduced by long-distance telephone transmission systems. In order to determine speech endpoints accurately, speech must be accurately distinguishable from all of these artifacts and background noise.

According to some embodiments of the present disclosure, an ASR system can take a hybrid approach to decoding speech using hardware and software located on the local device. For instance, a local device can include a WFST accelerator that is a hardware component specifically designed to use the H, C, and L models (in addition to a background G model in some embodiments) to decode speech data, which is a digital representation of the speech audio, into emission probabilities for different outputted words. The outputted words can be written into a memory device external to the WFST accelerator that can be accessed by a central processing unit (CPU) in the local device. The CPU can use a different personalized G model to re-score the emission probabilities for the outputted words into new emission probabilities.

This hybrid approach enables the local device to quickly and more accurately decode speech spoken by a user. A vast majority of the decoding of the WFST model can be performed locally without constantly having to send a substantial amount of data to a server. Furthermore, rescoring the emission probabilities based on personalized G models stored in memory can improve the accuracy and versatility of the speech recognition capabilities of the local device. Moreover, by implementing the grammar model(s) in software, different grammar models can be infinitely customizable by simply reprogramming the code, thereby substantially improving the versatility of the ASR system.

In some embodiments, a method for decoding speech includes receiving speech input at an audio input device; generating speech data that is a digital representation of the speech input; extracting acoustic features of the speech data by segmenting the speech data into frames and matching the frames of speech data to corresponding acoustic features, the acoustic features representing sounds capable of being spoken by humans; assigning acoustic scores to the acoustic features, each acoustic score being assigned to a respective acoustic feature, and each acoustic score representing a probability of the respective acoustic feature existing in the speech; receiving data representing the acoustic features and the acoustic scores; decoding the data representing the acoustic features into a word, having a word score, by referencing a WFST language model, the word score representing a probability of data representing the word existing in the speech data, wherein the WFST language model includes information about relationships between a sound and a corresponding word of a spoken language; modifying the word score into a new word score based on a personalized grammar model stored in the external memory device, the processor is separate from and external to the WFST accelerator; and determining an intent represented by a plurality of words outputted by the WFST accelerator, wherein the plurality of words include the word and the new word score.

In addition to providing a hybrid approach to decoding speech represented in digital form as speech data, some embodiments of the present disclosure also improve endpointing capabilities of the ASR system. In some instances, a WFST accelerator can include an endpointing module that is configured to count the number of frames of speech data that do not have audio data. The WFST accelerator can then take into account the total number of such frames in conjunction with a final mark that indicates whether the series of words outputted by the WFST accelerator is likely an endpoint to identify whether the user has stopped speaking. In some embodiments, an input label from the WFST language model for a frame of the speech data can have a bit earmarked for indicating whether the frame of speech data includes audio data (meaning a spoken sound is present) or the frame of speech data includes silence data (meaning no spoken sound is present and the frame does not include audio data or the frame includes audio data that is representative of silence). Each time a frame including silence data (e.g., "silent frame") is encountered, the endpointing module can increment a counter in the hardware of the WFST accelerator to keep track of the number of silent frames that have occurred. Once a threshold number of silent frames are encountered and a positive final mark has been encountered, the endpointing module can identify that an endpoint has been reached. Utilizing the endpointing module in the WFST accelerator can improve the speed and accuracy of the ASR system in identifying an endpoint for speech so that the ASR system does not cease speech processing at the incorrect time.

In some embodiments, a method for speech endpoint detection includes receiving identification data for a first state associated with a first frame of speech data from a WFST language model, the identification data including a silence bit that indicates whether the first frame includes audio data or silence data, where the WFST language model includes information about relationships between sounds and words for a spoken language; determining that the first frame of the speech data includes silence data; incrementing a silence counter associated with the first state, the silence counter being stored in an active state list within local memory of the WFST accelerator, where the active state list associates the first state with a second state, the second state representing a second frame of speech data different from the first frame of speech data represented by the first state; copying a value of the silence counter of the first state to a corresponding silence counter field in the second state; determining that the value of the silence counter for the first state is above a silence threshold, which indicates that a pause in speech has extended longer than a predetermined amount of time; in response to determining that the silence counter is above the silence threshold, determining that an endpoint of the speech has occurred; and outputting text data representing a plurality of words determined from the speech data that was received prior to the endpoint.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

FIG. 1 illustrates a block diagram of an example operation 100 of an ASR system configured for hybrid decoding, according to some embodiments of the present disclosure. Speech input 102 can be received by an audio input device 104. For instance, words spoken by a person can travel through the air as speech input 102 and then be captured by a microphone, which operates as audio input device 104. Audio input device 104 can receive speech input 102 and convert it into speech data 105 that is a digital representation of speech input 102. Audio input device 104 can be any type of recording instrument, such as a condenser microphone, dynamic microphone, ribbon microphone, etc., and may be directional or not directional. In some embodiments, the ASR system can receive speech data 105 directly from a recording without the use of audio input device 104.

Speech data 105 can then be received by a feature extraction module 106, which can be configured to analyze speech data 105 and convert speech data 105 into acoustic features. Feature extraction module 106 can be any suitable device capable of converting data representing sound into data representing acoustic features 107, such as a digital signal processor. Speech data 105 can be converted into data representing acoustic features by segmenting speech data 105 into frames, and then matching each frame of the speech data to one or more data representing the acoustic features. Acoustic features 107 can represent a set of sounds capable of being spoken by humans, e.g., fundamental building blocks of spoken sounds. In some embodiments, feature extraction module 106 can be implemented as a neural network accelerator (NNA) that can dynamically change the various features that are sought to be identified in acoustic signal 105. Using a NNA to perform feature extraction can allow the ASR system to extract only those specific acoustic features that are of interest to the specific needs and modes of operations. It is to be appreciated that the description herein may reference what the data represents, such as speech, acoustic features, arc, input label, state of a FSM, and the like, rather than explicitly state "data representing" such features, and that one skilled in the art understands whether the description is referring to the data instead of the feature itself based on the context in which it is described and a general understanding that hardware components and computer devices operate using data, specifically binary data at the lowest levels.

Acoustic features 107 can then be received by an acoustic modeling module 108, which can be configured to analyze acoustic features 107 and assign acoustic scores 109 to each acoustic feature 107. An acoustic score can be a probability of a corresponding acoustic feature existing in speech input 102. Acoustic modeling module 108 can be any suitable device capable of applying a set of calculations to acoustic features to identify emission probabilities of the acoustic features, such as a NNA.

Acoustic scores 109 are then sent to the WFST accelerator 110, which is configured to reference a WFST language model 113 to determine the most likely text, or transcribe a plurality of words 117, for inputted speech input 102. As an example, WFST accelerator 110 can use an HMM to convert phones to tri-phones, a context model to map a sequence of tri-phones to a single phoneme, and a lexicon model to convert phonemes to words. WFST accelerator 110 can include various logic blocks and data structures in local memory on the WFST accelerator for decoding speech using a WFST language model to identify the probabilities of certain words existing in inputted speech input 102, as will be discussed further herein. The WFST can be stored in an external memory device 114 so that WFST accelerator 110 can reference certain parts of the WFST language model during decoding. Accordingly, WFST accelerator 110 can be configured to read from external memory device 114.

In some embodiments, words and their scores 111 determined using the lexicon model and/or a background grammar model can be written into external memory device 114 by WFST accelerator 110 so that a CPU 112 coupled to memory device 114 can read the words and apply a personalized grammar model to the words. The background grammar model can identify a probability of the word being a part of a coherent sentence formed by other words in the lattice (e.g., chain of words). The personalized grammar model can be a grammar model that more accurately identifies whether the word is part of a coherent sentence for a specific user. For instance, if a user calls a television "telly", the word "telly" can be assigned a higher probability value according to the personalized grammar model. The words and their new scores 115 determined based on the personalize grammar model can then be rewritten by CPU 112 into memory device 114, which can then be read and re-stored in local memory in WFST accelerator 110. In some embodiments, CPU 112 can be configured to access the words and their scores directly from WFST accelerator 110 without having to access it indirectly from memory device 114 while bypassing memory device 114. In such cases, CPU 112 can read the words and their scores, apply the personalized grammar model to the words and their scores to determine a new score 119, and then directly store the new score into WFST accelerator 110. By having its words re-scored by an external processor with access to the personalized grammar model, WFST accelerator 110 can maintain a list of words with more accurate probabilities to improve the accuracy of the speech decoding. Further details of such operations are discussed further herein with respect to FIG. 4A. By implementing the grammar model(s) in software, different grammar models can be infinitely customizable by simply reprogramming the code, thereby increasing the versatility of the ASR system. And, by implementing the H, C, and L models in a special hardware component, e.g., WFST accelerator, processes that relate to fundamental acoustic features of speech shared amongst any personalized grammar model can be computed locally, thereby substantially increasing ASR speed.

In some embodiments, WFST accelerator 110 includes an endpointing module 116 configured to identify when the end of speech has occurred. End of speech occurs when a user is done speaking a command, rather than during a pause in the middle of speaking a command. Endpointing module 116 can be implemented in hardware and be configured to count a number of silent frames leading up to a certain state, determine that the number of silent frames has exceeded a threshold number of silent frames, and then commence endpointing when it determines that the nature of the most recently outputted word has a high probability of being the end of a spoken sentence. According to some embodiments of the present disclosure, one way endpointing module 116 can count the number of silent frames is by analyzing an input label (e.g., pdf-id) of each frame of the speech data. The input label can be modified by earmarking one bit of the pdf-id to mark whether the frame is silent or non-silent. If the frame is silent, then a counter field in an active state list contained in hardware can be incremented by one and the next frame can be analyzed. This repeats until a non-silent frame is encountered or the number of silent frames counted has exceeded a threshold number. Further details of this operation is discussed further herein with respect to FIGS. 6-8.

Once WFST accelerator 110 has identified that an endpoint has been reached in speech data 105, plurality of words 117 can be outputted to a natural language understanding (NLU) module 118. In some embodiments, NLU module 118 can be configured to take textual input and attempt to make a semantic interpretation of the text. That is, the NLU can determine the meaning behind plurality of words 117 based on the individual words and derive an intent or a desired action from speech input 102 as well as the pertinent pieces of information in the text that allow a device to complete that action. For example, if a spoken utterance is processed using the ASR system and outputs the text "set temperature to eighty" the NLU process may determine that the user intended to activate a thermostat in his/her home and to set the temperature in the home to eighty degrees. In some embodiments, NLU module 118 can be implemented as a software module that can be implemented by a processer, such as CPU 112.

Figure 2A:
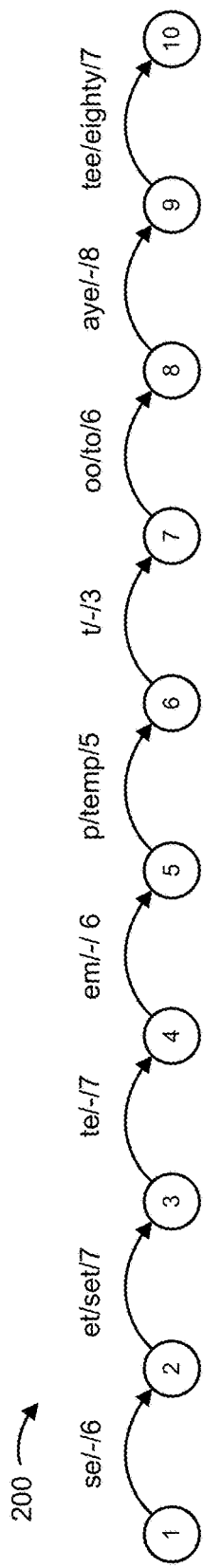
FIG. 2A illustrates a graph following traversal of a lexicon model of a WFST language model for outputting words, according to some embodiments of the present disclosure.
Figure 2B:
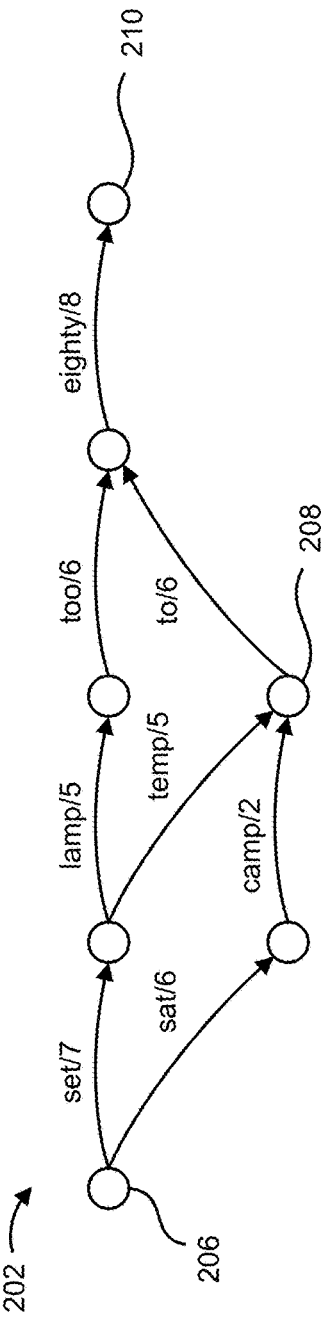
FIG. 2B illustrates a graph following traversal of a grammar model of the WFST language model for outputting a plurality of words and their scores, according to some embodiments of the present disclosure.
Figure 2C:
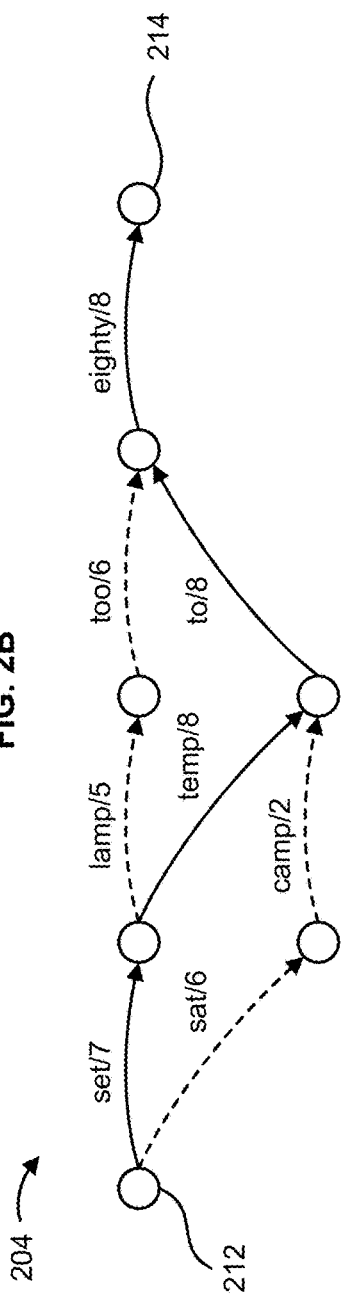
FIG. 2C illustrates a graph representing the graph in FIG. 2B after a personalized grammar model is traversed by a processor executing software to re-score one or more words in the graph in FIG. 2B, according to some embodiments of the present disclosure.

To better understand how a WFST accelerator, according to some embodiments of the present disclosure, decodes speech using the hybrid decoding approach, FIGS. 2A-2C illustrate example graphs/word lattices outputted by a WFST accelerator that is decoding speech saying "set temp to eighty." Specifically, FIG. 2A illustrates a graph 200 following traversal of a lexicon model of the WFST for outputting words, FIG. 2B illustrates a graph 202 following traversal of a background grammar model of the WFST for outputting a plurality of words and their scores, and FIG. 2C illustrates a graph 204 representing graph 202 after a personalized grammar model is traversed by a processor executing software to re-score one or more words in the plurality of words.

During speech recognition, a WFST accelerator may utilize acoustic models to determine possible phonemes or other phonetic units that match the incoming speech data feature vectors. The probable phonemes and related states/state transitions may be formed into paths traversing a lattice of potential phonemes. Each path represents a progression of phonemes that potentially match the audio data represented by the feature vectors. One path may overlap with one or more other paths depending on the recognition scores calculated for each phoneme. Certain probabilities are associated with each transition from state to state. A cumulative path score may also be calculated for each path. This process of determining scores based on the feature vectors may be called acoustic modeling. When combining scores as part of the ASR processing, scores may be multiplied together (or combined in other ways) to reach a desired combined score or probabilities may be converted to the log domain and added to assist processing.

One example of this is shown in FIG. 2A, where transitions between states are represented by arcs. For the lexicon model, each state can represent a specific phoneme and each arc can represent how likely the transition between the states is occurring based on the acoustic model in the WFST. Each arc can include an input label (i), output label (o), and a weight (w), as shown in the format of i/o/w. The input label can be an index into the WFST, the output label can be an outputted word from combining a series of immediately prior states of phonemes, and the weight can indicate the likelihood of taking the respective arc. In some embodiments, the input label can be identification data, such as a pdf-id, that identifies a specific state in the WFST; thus, references to "input label", "identification data", and "pdf-id" are interchangeable. A frame of speech data can be defined by a period of time, such as around 10 ms. Often, a single phoneme can be expressed in one frame, so a frame of speech data can correspond to a state in graph 200.

When "set temp to eighty" is spoken and its sequence of phonemes is identified by the WFST accelerator according to the context model, each phoneme can be associated with a corresponding input label/identification data (e.g., pdf-id) into the WFST model to identify a probability (e.g., weight w) indicating the likelihood of taking the respective arc. For instance, the pdf-id for the "se" phoneme is used as an index into the WFST model and a weight of 6 can be received from the WFST model. The same can be said for the following nine states (e.g., states 2-10) shown in FIG. 2A. For graph 200, higher weights can indicate a higher likelihood of taking the respective arc, although some alternative embodiments can be configured so that lower weights can indicate a higher likelihood of taking the respective arc. This continuous fetching of probabilities can continue until all of the frames for the spoken utterance has ended and the weights for each phoneme has been acquired from the WFST model.

As can be seen in FIG. 2A, not all arcs can have an output label. Output labels may exist when a phoneme is the final phoneme of a sequence of phonemes that the WFST model indicates has a likelihood of being a spoken word. For instance, the arc for states 2, 5, 7, and 9 can have output labels that can represent words that sound like "set temp to eighty". It is to be appreciated that the WFST accelerator is operating on acoustic features and that some other words that sound like the actual word being uttered may also be identified as having a high probability of being spoken, such as "set" and "sat" or "too" and "to". To determine which words are more likely to be the correct spoken word, the WFST accelerator can use the grammar model/language model, of the WFST.

Grammar modeling involves determining scores for what words are likely to be used together to form coherent words and sentences. Application of a grammar model may improve the likelihood that the ASR system correctly interprets the speech contained in the spoken sound. For example, for an input sound sounding like "to," acoustic model processing that returns the potential phoneme paths of "too" and "two" may be adjusted by a grammar model to adjust the recognition scores of "to" (interpreted as the word "to"), "too" (interpreted as the word "too"), and "two" (interpreted as the word "two") based on the language context of each word within the spoken utterance.

An example of this is shown by graph 202 in FIG. 2B. Graph 202 shows multiple potential paths of speech recognition results. Paths between nodes represent potential words identified from specific sequences of phonemes. The two paths between node 206 and node 208 represent two potential word choices, "set temp" or "sat camp". Each path point between nodes (e.g., potential words) is associated with a recognition score represented by a word weight. The word weight can represent a probability of that word existing in the associated feature vectors, e.g., existing in the spoken sound. Each path across the lattice may also be assigned a recognition score represented by a series weight. The series weight can represent a probability of that series of words being spoken. The highest series weight, where the score is a combination of the acoustic model score, the grammar model score, and/or other factors for the phonemes and words in the series, may be outputted by the WFST accelerator to an NLU module for identifying its intent.

As can be understood with reference to FIG. 2B, the probability for outputting the plurality of words "set lamp too eighty" and "set temp to eighty" between nodes 206 and 210 are roughly the same. Thus, there is a likelihood of the WFST accelerator outputting an incorrect textual representation of the spoken utterance of "set lamp too eighty" while the spoken utterance was actually "set temp to eighty".

According to some embodiments of the present disclosure, one or more word weights for the words in each potential path can be re-scored based on a personalized grammar model applied by software executed by an external processor, e.g., CPU 112 in FIG. 1. The words for all of the paths in the graph can be written into external memory, and the external processor can then apply a personalized grammar model to the words to re-score one or more words based on the personalized grammar model. In some embodiments, the personalized grammar model can include words that are specific to a certain user. For instance, if a unique name is given to a particular device by the user or if the user says a unique word that does not exist in typical speech, the unique name and the unique word can be recognized by the personalized grammar model and given higher weights. The personalized grammar model can also modify other words based on coherency with the unique word. As an example, the personalized grammar model can identify that "temp" is the user's way of saying "temperature" and thus re-score the word weight for "temp" to 8 as shown in FIG. 2C. And, now that the personalized grammar model has identified the meaning of temp, the word weight of the word "to" can also be increased as the personalized grammar model can enable the external processor to identify the coherence of the words "set temp to". Thus, the word weight of the word "to" can be increased to 8. Accordingly, the path between nodes 212 and 214 can correctly represent the word choice, "set temp to eighty". The new word weight can be determined by identifying where the unique word or name is located in the personalized model and acquiring the weight for the new word or name.

In some embodiments, re-scoring of the word weights by the personalized grammar model can only be positive, meaning the probabilities represented by word weights may not be decreased, but only increased. That way, pruning operations that attempt to remove certain words below a threshold probability do not remove all of the possible words at a node in a graph, which can result in an incomplete processing of a spoken utterance. Thus, re-scored word weights represent probabilities that are higher than, or equal to, the word weights prior to re-scoring.

Figure 3:
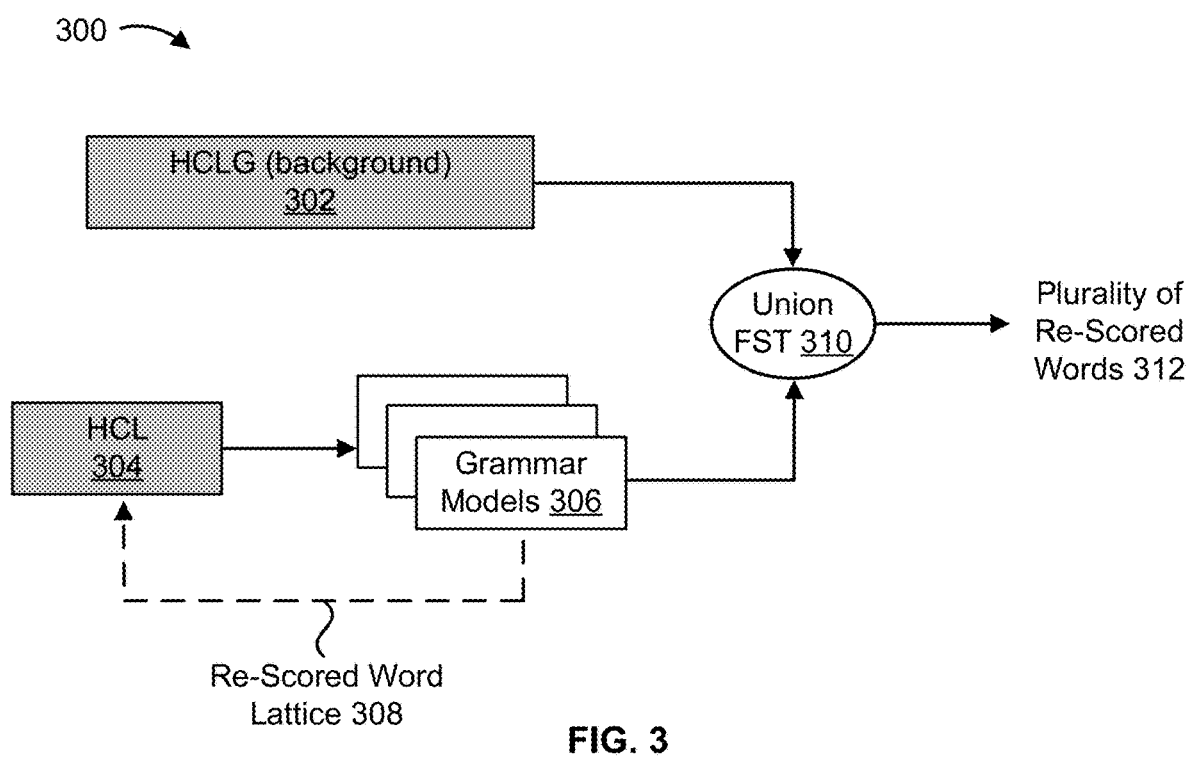
FIG. 3 illustrates a simple block diagram of the hybrid decoding scheme of an ASR system, according to some embodiments of the present disclosure.

FIG. 3 illustrates a simple block diagram 300 of the hybrid decoding scheme of an ASR system, according to some embodiments of the present disclosure. Each block of block diagram 300 can represent portions of a WFST model that is implemented in hardware or software, and each arrow can represent the type of data moving between models/finite state transducers (FST). Models that are implemented in hardware are shown as grey boxes, and models that are implemented in software are shown as white boxes. A WFST accelerator, e.g., WFST accelerator 110 in FIG. 1, can be configured to implement the models in hardware, and an external CPU, e.g., CPU 112 in FIG. 1, executing code in an external memory device, e.g., memory device 114 in FIG. 1, can be configured to implement the models in software.

In some embodiments, a WFST accelerator can implement acoustic models H, C, L, and G (e.g., HCLG 302) locally in a local device. The WFST accelerator can be an electrical component that is specially designed to perform decoding of WFST language models, as will be discussed further herein with respect to FIG. 4A. That way, a separate computer processor configured to operate the general functionality of the local device does not need to expend significant computational resources to decode the H, C, L, and G models of the WFST language model. Furthermore, the specially designed WFST accelerator can decode HCLG 302 much quicker than the CPU because of its specific design and implementation in hardware, and because it does not have to send the data to a remote server.

The grammar model in HCLG 302 can be a background grammar model that is trained to model a language under its general use. Training of the background grammar model can be performed using a training corpus including published articles and books. The general use of the words gleaned from the training corpus can train the background grammar model to identify how words can be combined to form coherent words and sentences that is used in general speech. Some words and sentences that may be spoken by a user, however, may not be represented in the training corpus for the background grammar model. Thus, words having meaning to a specific user may not be identified or scored accordingly by the background grammar model.

Furthermore, the number of unique words spoken by a user can continuously change as the user may tend to learn new words or find new ways to convey certain words in his or her everyday speech. Implementing new words into the language model (e.g., HCLG 302), let alone configuring the WFST accelerator to implement such new words in its hardware operations can be a difficult and impractical, especially when the ASR device is being used by a consumer.

Thus, according to some embodiments of the present disclosure, a word lattice (such as graph 202 in FIG. 2B for example) containing words decoded by the WFST accelerator using HCL 304 can be re-scored by a CPU executing software implementing personalized grammar models 306. Re-scored word lattice 308 can then be stored within the WFST accelerator as indicated by the dotted feedback loop arrow in FIG. 3. The re-scored words can then be unionized with the words decoded using the background HCLG 302 model by a union FST 310, which results in an output of a plurality of re-scored words 312 that has probabilities that more accurately represent the spoken utterance by the user. Each personalized grammar model 306 can correspond to unique words and names spoken by a specific user that have meaning to the user but are not typically found in background grammar models. Implementing personalized grammar models 306 in software allows them to be easily reconfigured and changed to adapt to the user's speaking habits.

Although FIG. 3 illustrates two separate HCL acoustic models (HCLG 302 and HCL 304), embodiments may not perform HCL acoustic model decoding twice. Rather, decoded words following a single iteration of HCL acoustic modeling can be applied to both the background grammar model in HCLG 302 and the personalized grammar models 306.

In some embodiments, the WFST accelerator is configured to write the words and scores determined from acoustic models HCL 304 into the external memory, read the words and new scores from the external memory, and store the new scores into its local memory to update its scores. Different data structures in local memory of the WFST accelerator can maintain a list of decoded words and states. For instance, a word lattice and active state list can be maintained by the WFST accelerator to keep track of the decoded acoustic features, words, and their probabilities, as will be discussed further herein with respect to FIG. 4A.

Figure 4A:
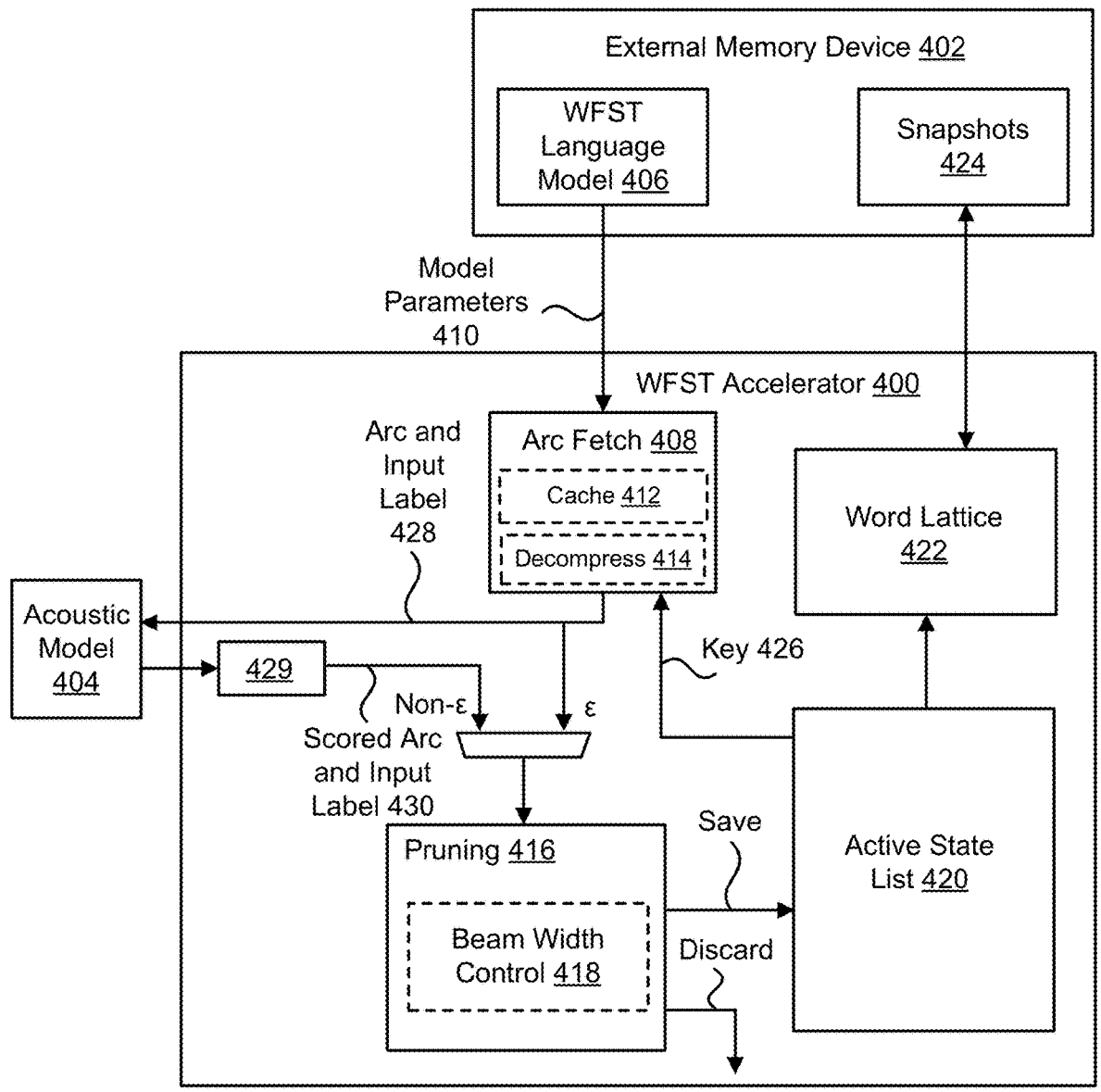
FIG. 4A illustrates a block diagram of an example WFST accelerator and its internal modules for hybrid decoding a WFST language model using hardware and software, according to some embodiments of the present disclosure.

FIG. 4A illustrates a block diagram of an example WFST accelerator 400 and its internal modules for hybrid decoding a WFST language model using hardware and software, according to some embodiments of the present disclosure. WFST accelerator 400 can be coupled to external memory 402 so that WFST accelerator 400 can read from and write to external memory 402. External memory 402 can include a WFST language model 406 that includes models H, C, L, and G for decoding speech as discussed herein. WFST language model 406 can be stored in compressed form to save memory space. WFST accelerator 400 can also be coupled to an acoustic model 404 to request and receive probabilities and output labels for specific acoustic features of frames of inputted speech.

In some embodiments, WFST accelerator 400 can include an arc fetch module 408 configured to fetch model parameters 410 from WFST language model 406. As an Example, arc fetch module 408 can use an index to identify where in WFST language model 406 to fetch possible arcs. The index can be identified based on a phone, tri-phone, phoneme, or word decoded from acoustic features of a spoken sound. In some embodiments, arc fetch module 408 can include a cache 412 and a decompression module 414. Cache 412 can be an any suitable memory component capable of enabling fast reading and writing of data, such as static random-access memory (SRAM). Cache 412 can store certain model parameters 410, e.g., arcs and input labels, that are often used to decrease the number of transactions with external memory 402. For instance, certain arcs and input labels that have been used a certain number of times greater than a use threshold can be stored in cache 412. That way, processing speed and bandwidth can be increased by not having to read from external memory device 402 for those arcs and input labels that are used more than others. Decompression module 414 can be a set of logic that can decompress model parameters 410 fetched from WFST language model 406. Fetch module 408 can be formed as a separate FSM or a portion of an entire FSM in WFST accelerator 400.

WFST accelerator 400 can also include a pruning module 416 configured to discard certain arcs or words that do not have a score above a pruning threshold value, and to save certain arcs or words that do have a score above the pruning threshold value. The pruning threshold value can be a probability value that establishes whether data representing the arc and input label is high enough to be considered in subsequent decoding steps to minimize wasteful calculations on arcs and input labels having low probabilities. Pruning module 416 can include a beam width control module 418 for modifying the pruning threshold value to control the stringency at which words are pruned in relation to a likelihood (e.g., final weight) of the word being the end of speech. For example, the pruning threshold value can be low when an outputted word has a low final weight. One example of this is when an outputted word is "the". Based on the general English language, speech is not likely to end in "the", and a large variety of sentences can be spoken after the word "the". So, it would be prudent for WFST accelerator 400 to accept as many possible words following the word "the" as possible to capture a wide range of possible words spoken after "the". Accordingly, WFST language model 406 can have a low final weight for the word "the" so that when "the" is encountered by WFST Accelerator 400 the pruning threshold value can be set low. As words with higher final weights are encountered, the pruning threshold value can be increased as the sentence expands.

In some embodiments, WFST accelerator 400 can also include an active state list 420 and a word lattice 422. Active state list 420 and word lattice 422 can be data structures that store states and words in local memory of WFST accelerator 400. Active state list 420 can store a list of states and their scores that are currently being tracked by WFST accelerator 400. For instance, FIG. 4B illustrates active state list 420 stored with certain states and keys, according to some embodiments of the present disclosure. Continuing with the example discussed with respect to FIG. 2A, active state list 420 can store states 1-10 along with their respective state scores 1-10, e.g., weights (w). In some cases, active state list 420 can also include a list of keys 1-N, each having a corresponding source value and destination value that can be used together as an index into WFST language model 406 to identify where in the language model to locate a specific state and how many of its associated arcs need to be fetched.

Word lattice 422 can store a list of words and their scores that are currently being tracked by WFST accelerator 400. Each entry of word lattice 422 can include a predicted word, a series of states that form the predicted word, and a weight associated with the predicted word indicating the likelihood of the predicted word existing in the inputted speech. As an example, FIG. 4C illustrates word lattice 422 stored with certain words and scores, according to some embodiments of the present disclosure. Word lattice 422 can include a start state, an end state, and a score for X output labels. Thus, continuing with the word "temp" in the example discussed herein with respect to FIG. 2B, word lattice 422 can include the predicted word (e.g., output label) "temp", source state 3 and destination state 5 from FIG. 2A, and the word score (e.g., weight of 5) associated with the word "temp". Each predicted word in FIG. 2B can be listed in word lattice 422. WFST accelerator 400 can store a word into word lattice 422 when an output label is encountered in a frame from an acoustic model in WFST language model 406. It is to be appreciated that state list 420 and word lattice 422 are constantly expanding as WFST accelerator 400 is in the middle of decoding speech. So, at a specific time during decoding, only those words and acoustic features that have been encountered and tracked can be stored in word lattice 422 and state list 420, respectively, at a time.

According to some embodiments of the present disclosure, words and scores in word lattice 422 can be written into external memory 402 as snapshots 424 so that external devices, e.g., external CPU CPU 112 in FIG. 1, can access and run personalized grammar models on the words to re-score the weights of one or more of the words. Snapshots 424 can be the current list of words in word lattice 422 each time a frame of the speech is decoded. As discussed herein, personalized grammar models can be maintained by software and used by an external CPU executing instructions in external memory 402 to identify whether some of the words in word lattice 422 are unique words specific to the user that may not exist in a background grammar model. Implementing the personalized grammar models in software allows the ASR system in which WFST accelerator 400 is implemented to utilize the speed and bandwidth benefits achieved by a specially designed accelerator with the versatility and ease of configurability of software code to accurately decode speech.

A better understanding of how the modules operate together can be understood with reference to an example decoding operation. During a decoding operation, a key 426 can be sent from active state list 420 to arc fetch module 408, which can use key 426 to identify where in WFST language model 406 to read an input label and its possible arcs. Key 426 can be an index and can include a source value and a destination value as discussed herein. In some embodiments, key 426 is an identification number for a specific state in WFST language model 406 that corresponds to the input label (e.g., pdf-id). Arc fetch module 408 can then receive model parameters 410 associated with the specific index into WFST language model 406. For instance, arc fetch module 408 can receive data representing an arc and input label (e.g., identification data) 428, which can be an arc associated with a specific input label (e.g., pdf-id) from WFST language model 406. As an example, an arc with input label "te" can be fetched from WFST language model 406. The arc can include an output label and a language model score for the input label. The language model score can be a score determined from WFST language model 406 that is modeled according to a background model as discussed herein. Data representing arc and input label 428 can then be used to reference acoustic model 404 to identify the acoustic score of the acoustic feature. The acoustic score can be received by a scoring module 429 to calculate a scored arc and input label 430. The score for the scored arc can be a combined score calculated by scoring module 429 of WFST accelerator 400 based on the language model score from WFST language model 406 plus the acoustic score of the acoustic feature from acoustic model 404 multiplied by an acoustic scale. The acoustic scale can be a value that defines a specific weight given to the acoustic score. Higher acoustic scales give greater weight and deference to the acoustic score, and vice versa. The score can represent a likelihood that the arc existed in the acoustic feature of the current frame. An example of a scored arc is "te/-/7" for state 3 in FIG. 2A. If the arc fetched from WFST language model 406 does not include an input label, in which case there is no input label that can be scored by acoustic model 404, the arc can be an epsilon (ε) arc that bypasses acoustic model 404.

Scored arc and input label 430 can then be pruned by pruning module 416 and saved into active state list if the combined score for the arc is greater than a pruning threshold value or discarded if the combined score is less than a pruning threshold value. If the arc includes an output label, a series of arcs between a source state and a destination state leading up to the arc can be stored in word lattice 422. The series of arcs can represent a possible word identified using the series of arcs. For instance, arc "p/temp/5" can have an output label "temp" that is formed by arcs between source state 3 and destination state 5, as discussed in FIG. 2C. The words in word lattice 422 can then be written into external memory 402 as snapshots 424 so that an external CPU can re-score the words based on a personalized grammar model. As an example, the word "temp" can be re-scored from 5 to 8, as discussed in FIG. 2C. The re-scored words can then be stored back into word lattice 422 to replace one or more of the scores with the new scores based on the personalized grammar model. If the arc does not have an output label, then the destination state of the arc can be used as the next input label to fetch the next arc(s) for the destination state. For instance, the key associated with the destination state can be used to fetch the arc(s) and the input label for the destination state. This process repeats until an endpoint is detected, as will be discussed further herein.

Figure 5:
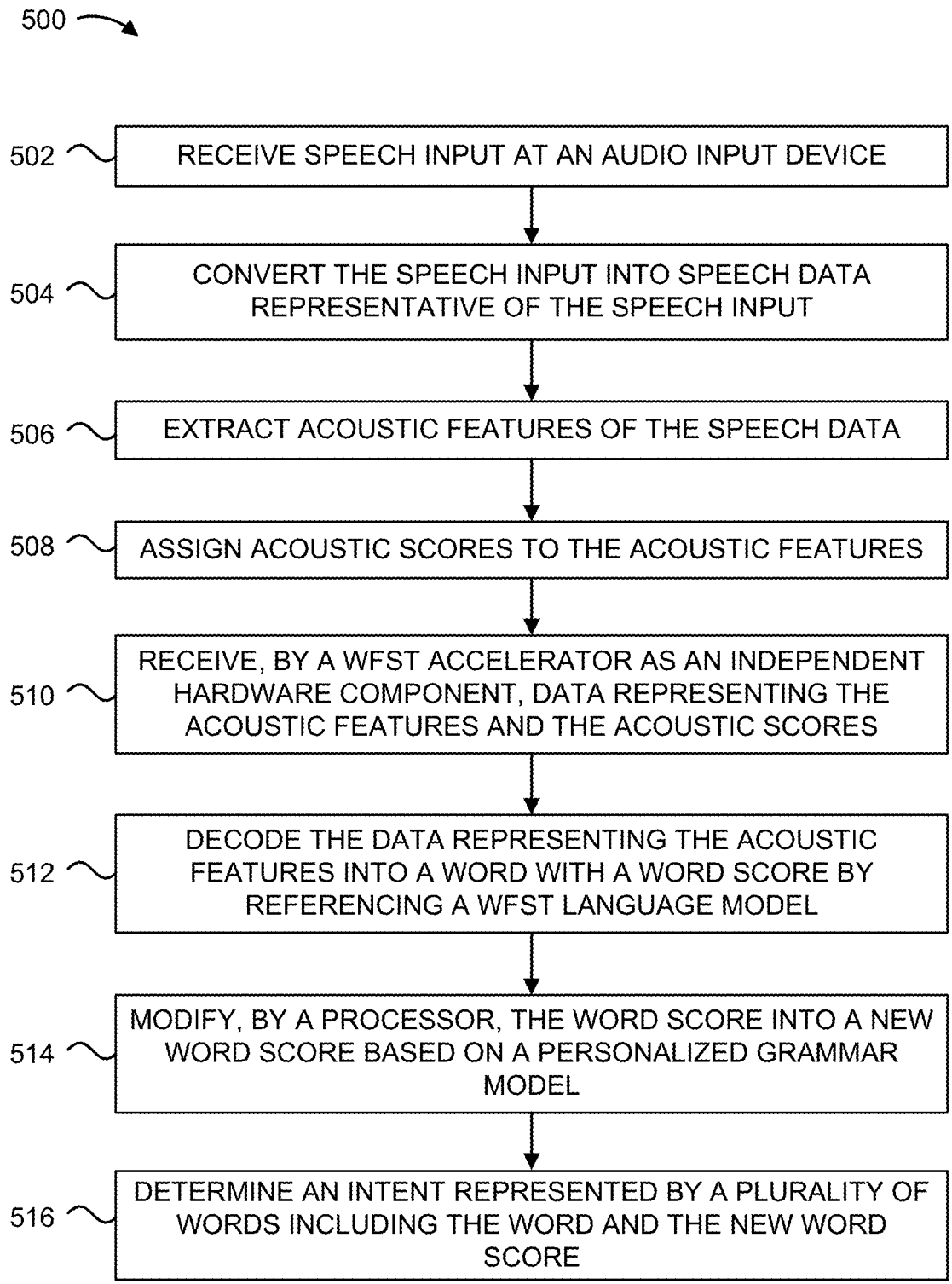
FIG. 5 illustrates a flow diagram of an example method for performing hybrid decoding of speech by an ASR system, according to some embodiments of the present disclosure.

FIG. 5 illustrates a flow diagram 500 of an example method for performing hybrid decoding of speech by an ASR system, according to some embodiments of the present disclosure. At step 502, speech input can be received by an audio input device, such as audio input device 104 in FIG. 1. For instance, a microphone can receive speech spoken by a user. The audio input device can be any type of recording instrument, such as a condenser microphone, dynamic microphone, ribbon microphone, etc., and may be directional or not directional. At block 504, the speech input can be converted into speech data that is representative of the speech. As an example, the audio input device can receive the speech input and convert it into speech data that is a digital representation of the speech.

At block 506, acoustic features of the speech can be extracted by a feature extraction module, such as feature extraction module 106 in FIG. 1. The feature extraction module can be a digital signal processor configured to analyze the speech data and map them to acoustic features. The speech data can be mapped to acoustic features by segmenting the speech data into frames, and then matching the frames of speech data to corresponding acoustic features. For instance, the frames of speech data can be converted into frequency or cepstral domain, such as in the formation of mel-frequency cepstral coefficient vectors, which represent the power spectrum of the speech data. A mel scale is a subjectively perceived non-linear scale of the audible spectrum. The acoustic features can represent a set of sounds capable of being spoken by humans, e.g., fundamental building blocks of spoken sounds.

At block 508, the acoustic features can be assigned acoustic scores by an acoustic modeling module, such as acoustic modeling module 108 in FIG. 1. The acoustic modeling module can be configured to analyze the acoustic features and assign scores to each acoustic feature according to an acoustic model. The acoustic model can include information about a relationship between an acoustic feature and a probability of the acoustic feature existing in the speech data. An acoustic score can represent the probability of the acoustic feature existing in the inputted speech. The acoustic modeling module can be any suitable device capable of applying an acoustic model to acoustic features to identify emission probabilities of the acoustic features, such as an NNA.

At block 510, a WFST accelerator can receive data representing the acoustic features and the acoustic scores from the acoustic modeling module. The WFST accelerator can be an independent hardware component within the ASR system such as WFST accelerator 110 in FIG. 1. The WFST accelerator can be configured to, at block 512, reference a WFST language model to decode the data representing the acoustic features into a word with a word score by determining the most likely text, or transcribing a plurality of words, for the inputted speech. As an example, the WFST accelerator can use an HMM to convert data representing phones to tri-phones, a context model to map data representing a sequence of tri-phones to a single phoneme, and a lexicon model to convert data representing phonemes to words. Each word can be associated with a word score that represents a probability of the word existing in the inputted speech. The WFST accelerator can include various logic blocks and data structures in local memory on the WFST accelerator for performing decoding of a WFST model to identify the probabilities of certain words existing in the inputted speech, as discussed herein with respect to FIGS. 2-4. The WFST model can be stored in an external memory device, such as external memory device 114 in FIG. 1, so that the WFST accelerator can reference certain parts of the WFST language model during decoding.

Then, at block 514, a processor, e.g., CPU 112 in FIG. 1 or any other suitable processor such as a digital signal processor (DSP) or any other general purpose processor, coupled to the memory device and/or the WFST accelerator can modify the word score to a new word score based on a personalized grammar model stored in the external memory device. The CPU can execute instructions stored in the external memory device to read the word from the external memory device and apply the personalized grammar model to the word to determine the new word scores, as discussed herein with respect to FIG. 3.

At block 516, an intent represented by a plurality of words outputted by the WFST accelerator can be determined by an NLU module, such as NLU module 118 in FIG. 1. The plurality of words can be outputted by the WFST accelerator and can include the word and the new word score. The NLU module can be configured to take textual input and attempt to make a semantic interpretation of the text. That is, the NLU can determine the meaning behind the plurality of words based on the individual words and derive an intent or a desired action from the speech input.

By implementing the grammar model(s) in software, different grammar models can be infinitely customizable by simply reprogramming the code, thereby increasing the versatility of the ASR system. And, by implementing the H, C, and L models in a special hardware component, e.g., the WFST accelerator, processes that relate to fundamental acoustic features of speech shared amongst any personalized grammar model can be computed locally, thereby substantially increasing speech decoding speed.

As an ASR system is decoding speech, it is important to accurately identify when the speech has ended. If an incorrect endpoint of the speech is identified, the speech can be cut short and the ASR system may incorrectly identify an intent of the speech. According to some embodiments of the present disclosure, a WFST accelerator in an ASR system can be configured to perform enhanced endpoint detection to accurately identify when a speech has reached an endpoint. The WFST accelerator can identify that an endpoint has been reached by determining when at least the following three circumstances are satisfied: (1) a number of silence frames/arcs is above a silence count threshold, (2) a state score is above a state score threshold, and (3) a latest state with an output label has a positive final mark, as will be discussed further herein.

Figure 6A:
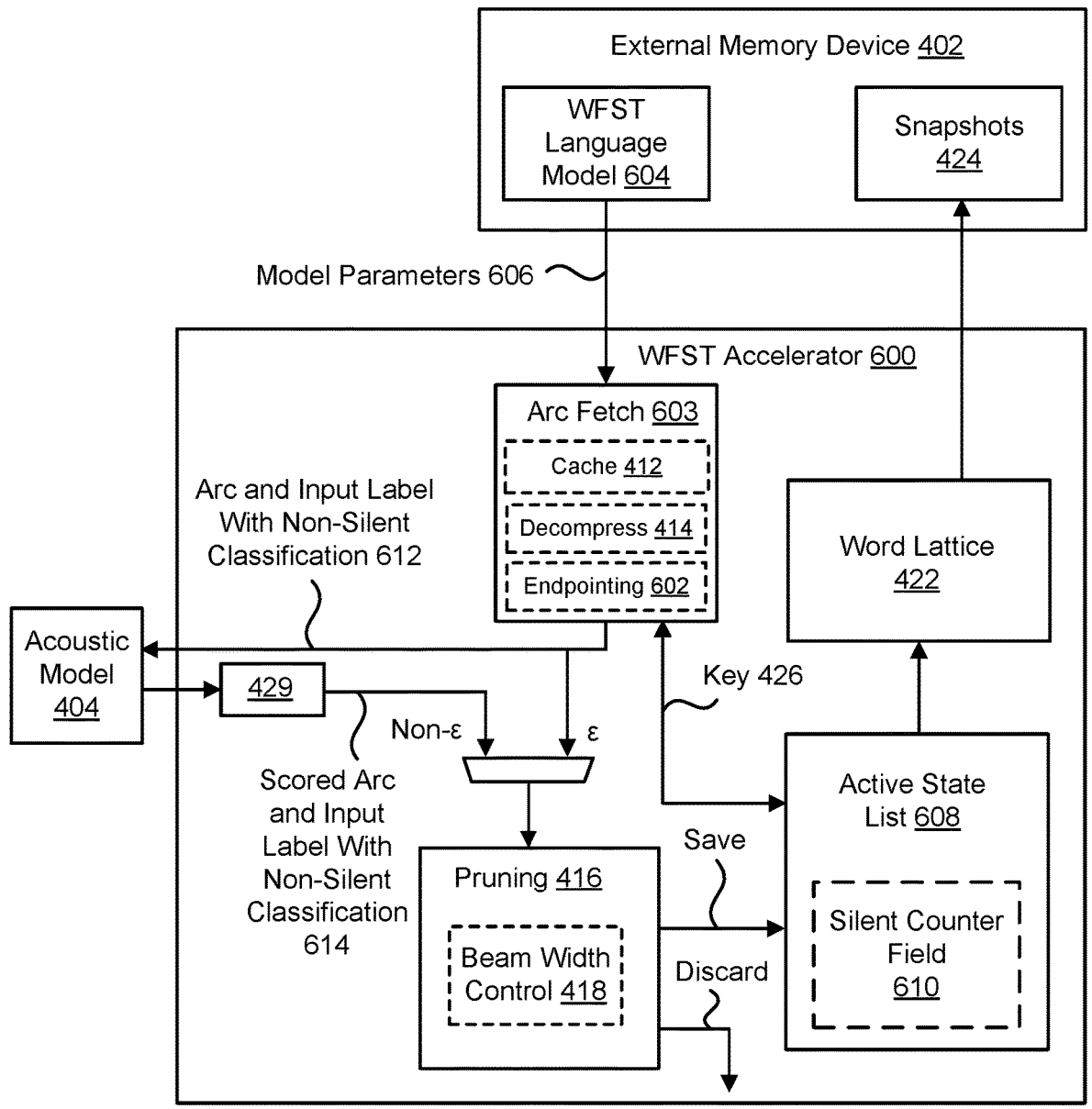
FIG. 6A illustrates an example WFST accelerator and its internal modules for hybrid decoding a WFST language model using hardware and software with a speech endpointing module implemented in hardware, according to some embodiments of the present disclosure.

FIG. 6A illustrates an example WFST accelerator 600 and its internal modules for hybrid decoding a WFST language model using hardware and software with a speech endpointing module 602 implemented in hardware, according to some embodiments of the present disclosure. Modules within WFST accelerator, as well as models and devices coupled to WFST accelerator that are substantially similar in operation, function, and construction as corresponding modules, models, and devices in FIG. 4A have the same reference numerals and are not discussed here for brevity.

In some embodiments, endpointing module 602 is implemented in arc fetch module 603 so that each time an arc is fetched from WFST language model 604, arc fetch module 603 can be configured to identify whether the frame of speech data represented by the state that is the source of the fetched arc includes audio data or silence data. The presence of audio data indicates that the frame of speech data is not silent, meaning the user is emitting sound associated with the speech; whereas, the presence of silence data instead of audio data indicates that the frame of speech data is silent, meaning the user is not emitting sound associated with the speech. Alternatively, endpointing module 602 can be implemented between arc fetch module 603 and acoustic model 404 so that endpointing module 602 can receive newly fetched arcs and input labels/pdf-ids from WFST language model 604 before the newly fetched arcs and input labels are sent to acoustic model 404. Endpointing module 602 can be coupled to active state list 608 so that endpointing module 602 to initiate incrementing a counter to track the number of silent frames, as will be discussed further herein.

One way to determine whether the arc is silent/non-silent (e.g., data representing the arc includes silence data or audio data) is to earmark one bit in a pdf-id (e.g., an input label/identification data for the arc), which is formed several bits (e.g., 16 bits), to indicate whether a frame of speech data associated with an arc is silent or non-silent. That is, if the arc is silent (meaning the frame of speech data includes silence data), then the earmarked bit in the pdf-id corresponding to the arc for the frame is set to "0", whereas if the frame is non-silent (meaning the frame of speech data includes audio data), then the earmarked bit in the pdf-id is set to "1", or vice versa. In some embodiments, WFST language model 604 can be configured so that pdf-ids in model parameters 606 fetched by arc fetch module 603 contain the earmarked bit.

Accordingly, arc fetch module 603 can be configured to identify when a pdf-id is indicated as silent and modify active state list 608 to keep track of the number of silent pdf-ids leading up to the current state. Each state in active state list 608 can include a silent counter field 610 that keeps track of the number of silent pdf-ids leading up to the current state as "silent count". As an example, FIG. 6B illustrates active state list 608 configured with a silent counter field 620, according to some embodiments of the present disclosure. Silence counter field 620 can be a designated area within the data structure that allows values for the silence counters to be stored in local memory. During an example operation, arc fetch module 603 can fetch model parameters 606 including an arc and its input label from WFST language model 604 in external memory device 402. The input label can be associated with a pdf-id that has a bit earmarked to indicate whether the frame of speech data with which the input label is associated is silent or non-silent. When arc fetch module 603 encounters a silent pdf-id, the silent count can be copied from a source state to a destination state and the silent count can be incremented by one. That way, the destination state, which will be the source state for the next frame, can have the incremented silent count so that if a subsequent silent pdf-id is encountered, the silent count can be copied again to the subsequent destination state and incremented by 1, and so on and so forth until a non-silent pdf-id is encountered. Once a non-silent pdf-id is encountered, meaning a frame has sound that can potentially be an acoustic feature of speech, the silent count counter can be reset to 0, only to be incremented again when another silent pdf-id is encountered. The non-silent pdf-id (e.g., arc and input label with non-silent classification 612 in FIG. 6A) can be outputted by arc fetch module 603 to acoustic model 404, which can score the arc and output the scored arc for the non-silent pdf-id (e.g., scored arc and input label with non-silent classification 614) to pruning module 416. By configuring arc fetch module 603 with endpointing module 602 to identify silent/non-silent pdf-ids, endpointing can be performed with hardware instead of software so that speech decoding processes can be performed locally with a dedicated accelerator to enhance processing speed.

An endpoint to the speech can be identified when the silent count exceeds a silence threshold, such as 5 for example, and when at least two other factors are present: (1) a state score is above a state score threshold and (2) the current state has a positive final mark. The silence threshold can be indicative of a predetermined amount of time that differentiates between a pause in speech and the end of speech. Taking into consideration these other factors when determining and endpoint in speech can enable a more robust and reliable determination as to whether endpointing has occurred. For example, simply speaking slowly with words separated by large gaps of silence may not result in premature endpointing because the states before the endpoint may not have high state scores or a positive final mark.

An output word state score can be a probability that the state exists in the speech. The output word state score can be for a most recent state with an outputted word. The output word state score can be determined from WFST language model 604. A final mark, on the other hand, can be a probability that the most recent state with an outputted word is the end of speech. The final mark can be determined based on a likelihood that the word is the end of speech according to a grammar model of WFST language model 604. For instance, states with output labels for words such as "the", "to", or "how" that typically do not end general speech. Thus, states with those output labels may have an end-of-speech probability (e.g., final mark) that is lower than a final mark threshold, in which case those states may have a null final mark instead of a positive final mark. Conversely, states with output labels for words such as "me", "time", "him", "tomorrow" and the like that typically do end general speech can have an end-of-speech probability that is higher than a final mark threshold, in which case those states may have a positive final mark. The final mark threshold can be a certain probability value that defines whether a word can be identified as the end of the speech and whether a word cannot be the end of the speech. Words having a probability value higher than the final mark threshold can be identified as words that have a high likelihood of being the end of the speech, while words having a probability value lower than the final mark threshold can be identified as words that have a low likelihood of being the end of the speech. Following this configuration, each state within active state list 608 can have a silent count, an output word state score, and a final mark. Accordingly, WFST accelerator 600 can identify when the speech has ended when (1) a silent count is above a silence count threshold, (2) the latest state with an output label has a state score above a state score threshold, and (3) the latest state with an output label has a positive final mark.

To better understand how a WFST accelerator according to some embodiments of the present disclosure performs endpointing for speech using hardware components, FIGS. 7A-7B illustrate example graphs/word lattices 700 and 701, respectively, outputted by a WFST accelerator that is being used to determine endpointing for speech saying "set temp to eighty." The graphs shown in FIGS. 7A and 7B illustrate states and arcs with silent and non-silent pdf-ids. Arcs with silent pdf-ids are labeled with "sil" and arcs with non-silent pdf-ids and their output labels are illustrated as a single, hashed node with an arc that includes its output label and word score. It is to be appreciated that such nodes with output labels represent groups of states that form the output label and is shown this way for simplicity. Furthermore, the arcs containing output labels can include a final mark following the word score. Thus, those arcs with output labels are labeled in FIG. 7A as "output label/word score/final mark" where the final mark is either null, e.g., "0", or positive, e.g., "1", where a null final mark indicates the state is unlikely to be an endpoint, and a positive final mark indicates that the arc is likely to be an endpoint. Each arc can represent a frame of speech data.

As "set temp to eighty" is being decoded by the WFST accelerator, a first silent pdf-id can be encountered by an arc fetch module at state 704. When the silent pdf-id is encountered, the arc fetch module can increment the silent count for state 704, which is a source state for that pdf-id at this instance of decoding, and copy the incremented silent count into state 706, which is a designation state for that pdf-id. This can repeat for each silent pdf-id until non-silent state 708 is reached, in which case the silent count for state 708 that currently contains a count of 3 silent pdf-ids leading up to state 708 is reset to 0. Since state 708 shown in FIG. 7A represents represent groups of states that form the output label as mentioned herein, the actual state that contains the silent count of 3 that gets reset to 0 would be the first non-silent state (not shown) within the group of states represented by state 708. This tracking and incrementing of silent count in hardware components of the WFST accelerator can occur each time a silent pdf-id is encountered, such as at states 710, 712, and 714 shown in FIG. 7A.

Continuing with the example graph/word lattice 700 shown in FIG. 7A, the WFST accelerator can identify that an endpoint of the speech occurs at state 716 if its state score is above the state score threshold because, at state 716, the silent count at state 716 is 6, which is above the silence count threshold of 5, and the latest state with an output label, e.g., state 718, has a positive final mark of "1". The state score can be defined by a highest sum of weights for a branch of words emitted prior to the state. For instance, the state score at state 716 for the branch of words resulting in "set temp to eighty" can be 31 (7+8+8+8). Often, there can be many state scores for each state depending on the different words identified by the WFST accelerator and the different branches of words emitted prior to the state. As an example, state 716 can have 3 state scores defined by 3 branches of words, where branch 1 is defined by "sat camp to eighty", branch 2 is defined by "set lamp too eighty," and branch 3 is defined by "set temp to eighty. In some embodiments, only the highest state score is used to identify whether the state score for the state is above the state score threshold. In certain cases, the state score can also take the final mark into consideration. If the final mark is positive, a certain amount of weight can be added to the state score to account for the final mark. Accordingly, the WFST accelerator can successfully decode the entire speech of "set temp to eighty."

Requiring the three factors to be satisfied to determine the presence of an endpoint can increase the accuracy and reliability of the WFST accelerator when determining an endpoint. This is because if one factor is not satisfied, the WFST accelerator may not determine that an endpoint has occurred. FIG. 7B illustrates the example graph/word lattice 701 where a large silence gap exists between "temp" and "to". This can occur when a pause is induced between "temp" and "to" in the speech. Accordingly, the silent count at state 720 is 6, which is above the silence count threshold of 5. Conventional systems relying only on the silence count for endpointing would cause the ASR system to identify that the endpoint occurs at state 720, which results in the decoding of only "set temp" and may result in an incorrect decoding of the speech. However, since a final mark of "temp" is "0" (e.g., null), the factor requiring the final mark to be set as positive is not met and thus the WFST accelerator does not identify the endpoint to be after "temp".

If the final mark of "temp" is set to "1" based on a different final mark threshold, the WFST accelerator may still not determine that an endpoint has occurred even if the silent count is also above the silence count threshold. This may be because of the state score factor requirement. At state 720, the two branches of words "set temp" and "sat camp" may result in two state scores 15 and 8, respectively. If the state score threshold is set to 30, then the highest state score for state 720 would be 15 and would thus not satisfy the state score threshold requirement. Accordingly, the WFST accelerator would not identify the endpoint to be after "temp". In some embodiments, only the branches of words having the highest scores are considered and compared to the state score threshold. For instance, at state 716, there may be three branches of words leading up to state 716, branch 1, branch 2, and branch 3 identified above. Branch 1 would have a state score of 24, branch 2 would have a state score of 26, and branch 3 would have a state score of 31. The WFST accelerator may be configured to only compare the top two state scores (26 and 31) to the state score threshold to identify whether the state score factor has been satisfied. That way, logic calculation resources can be used efficiently while still accurately decoding the speech data.

Figure 8:
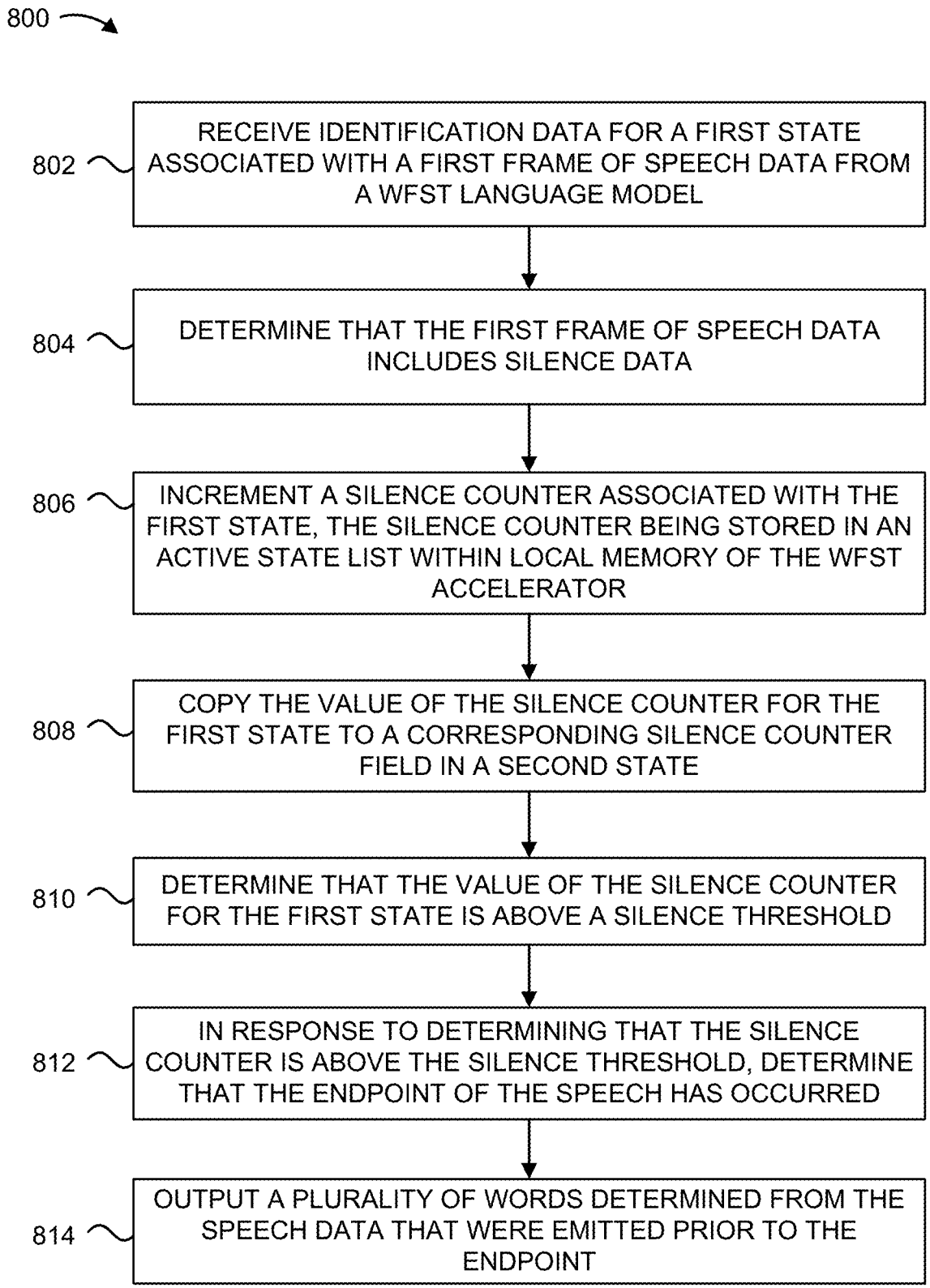
FIG. 8 illustrates a flow diagram of an example method for performing endpointing using hardware components in a WFST accelerator, according to some embodiments of the present disclosure.

FIG. 8 illustrates a flow diagram of an example method for performing endpointing using hardware components in a WFST accelerator, according to some embodiments of the present disclosure. At block 802, identification data, such as an input label or a pdf-id, for a first state associated with a first frame of speech data (e.g., a digital representation of a spoken speech input) can be received from a WFST language model. For example, an arc fetch module, e.g., arc fetch module 603 in FIG. 6A can fetch model parameters including the input label/identification data from WFST language model 604 in external memory device 402. The input label/pdf-id/identification data can have a silence bit that indicates whether the first frame of speech data with which the input label is associated includes audio data or silence data.

At block 804, an endpointing module can determine whether the silence bit in the input label for the state indicates that the first frame of speech data associated with the input label/identification data includes silence data. For instance, it can be determined that the silence bit is set to "0", which indicates that the frame of speech data includes silence data. Or, it can be determined that the silence bit is sent to "1", which indicates that the frame of speech data includes audio data. The endpointing module can be implemented in the fetch module, or it can be implemented as a separate module between the fetch module and an acoustic model, as discussed herein with respect to FIG. 6A.

In response to determining that a silence bit is encountered, at block 806, a silence counter associated with the state can be incremented by the endpointing module. The silence counter can be stored in an active state list within local memory of the WFST accelerator. In some embodiments, the active state list can associate the first state with a second state (e.g., a destination state) representing a second frame of speech data different from the first frame of speech data represented by the first state. For instance, the active state list can associate state 704 as a source state and state 706 as a destination state, as discussed herein with respect to FIG. 7A.

At block 808, a value of the silence counter of the state can be copied to the corresponding counter field in the destination state by the endpointing module. That way, the destination state, which will be the source state for the next frame, can have the incremented silence counter so that if a subsequent silent pdf-id is encountered, the silence counter can be copied again to the subsequent destination state and incremented by 1, and so on and so forth until a pdf-id/identification data associated with a frame of speech data including audio data is encountered.

At block 810, it can be determined by the WFST accelerator that the silence counter for the state is above a silence threshold. For instance, it can be determined that the silence count at state 716 in FIG. 7A is 6, which is greater than a silence threshold of 5. The silence threshold can be a number of silence frames that determines when a pause in speech has extended longer than a mere pause in speech and has become indicative of an end of speech. Then, in response to determining that the silence counter is above the silence threshold, at block 812, it can be determined that the endpoint of the speech as occurred. In some embodiments, in addition to identifying that the silence counter is above the silence threshold, the WFST accelerator can identify other factors to determine whether an endpoint has occurred. For instance, the WFST accelerator can also consider (1) whether a state score is above a state score threshold and (2) whether the current state has a positive final mark. The state score can represent the likelihood that the state exists in the speech, and the final mark can represent the likelihood that the state is the end of the speech. Both the state score and the final mark can be stored in the active state list.

At block 814, a plurality of words represented as text data determined from the speech data that were emitted prior to the endpoint can be outputted by the WFST accelerator. For instance, the plurality of words can be outputted to an NLU to determine an intent represented by the plurality of words.

Figure 9:
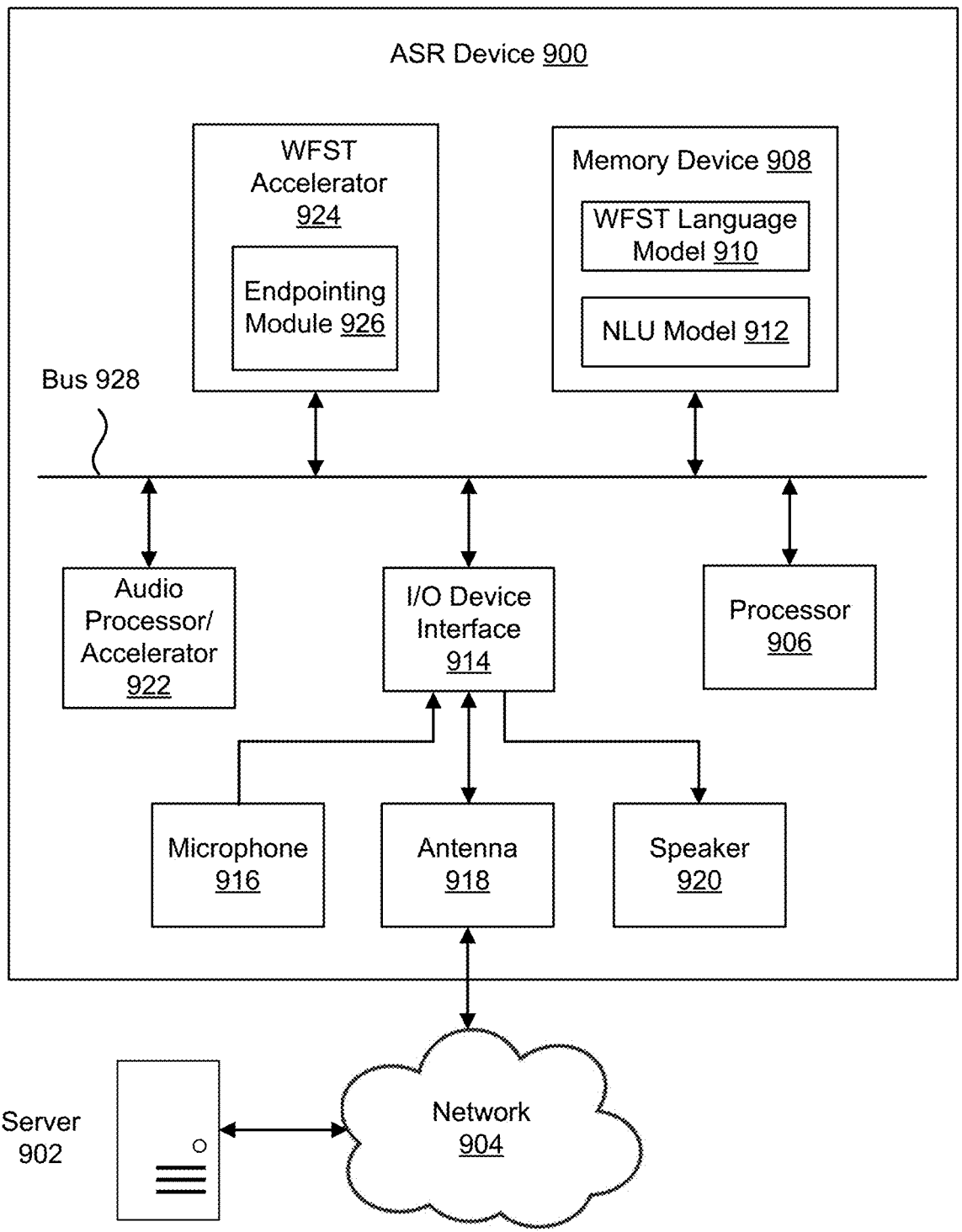
FIG. 9 illustrates a block diagram of an example ASR device coupled to a remote server through a wireless network, according to some embodiments of the present disclosure.

FIG. 9 illustrates a block diagram of an example ASR device 900 coupled to a remote server 902 through a wireless network 904, according to some embodiments of the present disclosure. ASR device 900 can be configured to perform hybrid decoding using a WFST accelerator and CPU resource and can be configured to perform endpointing using hardware within the WFST accelerator, as discussed herein.

ASR device 900 can include a processor 906 for processing data and computer-readable instructions, and a memory device 908 for storing data and instructions executable by processors 906. Processor 906 can be any suitable processing device, such as a CPU, microcontroller, application-specific integrated circuit (ASIC), and the like. Memory device 908 can be any suitable device capable of storing data, such as volatile random access memory (RAM), non-volatile read only memory (ROM), non-volatile magnetoresistive (MRAM) and/or other types of memory devices. In some embodiments, memory device 908 can store a WFST language model 910 containing H, C, L, and G models that map sounds to words as discussed herein, as well as store an NLU model 912, which can be lines of code that can be executed to identify an intent based on a plurality of words.

ASR device 900 can also include an input/output (I/O) device interface 914 coupled to a microphone 916, antenna 918, and a speaker 920. Microphone 916, or any other suitable audio input device, can receive sounds, e.g., speech, for performing ASR. Speaker 920, or any other audio output device, can output sounds to user. Antenna 918, or any other suitable communication device capable of connecting to network 904, can connect I/O ASR device 900 to network 904 via a wireless local area network (WLAN) (such as WiFi) radio, Bluetooth, and/or wireless network radio, such as a radio capable of communication with a wireless communication network such as a Long Term Evolution (LTE) network, WiMAX network, 3G network, and the like. Connecting I/O device interface 914 to network 904 allows ASR device 900 to access data in server 902, which may be useful for performing operations for a user, such as gathering weather data from a server at a weather station.

ASR device 900 can also include an audio processor/accelerator 922 to process speech datas inputted from microphone 916. For instance, audio processor/accelerator 922 can be a DSP or NNA for performing feature extraction and/or acoustic scoring as discussed herein.

According to some embodiments of the present disclosure, ASR device 900 can also include a WFST accelerator 924 configured as a specialized hardware component that is designed to decode speech as discussed herein. WFST accelerator 924 can reference WFST language model 910 and write to/read from memory device 908 to receive re-scored data, such as word lattices, as discussed herein with respect to FIG. 4C. The re-scored data can be generated by processor 906 by executing instructions in memory device 908 to apply personalized grammar models to the data. Furthermore, WFST accelerator 924 can include an endpointing module 926 that is configured as a hardware component to identify when end of speech has occurred. Endpointing module 926 can fetch input labels from WFST language model 910 and increment silence counters stored in a local memory of WFST accelerator 924, as discussed herein with respect to FIGS. 6-8.

To enable communication and data transfer between all of its components, ASR device 900 can include an address/data bus 928. Each component within device 900 can also be directly connected to other components in addition to (or instead of) being connected to other components across bus 928.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in the preceding figures, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method for tracking end of speech, the method comprising:
   receiving, by a fetch module implemented within a weighted finite state transducer (WFST) accelerator configured as a hardware component, identification data for a first state associated with a first frame of speech data from a WFST language model, the identification data including a silence bit that indicates whether the first frame includes audio data or silence data, wherein the WFST language model includes information about relationships between sounds and words for a spoken language;
   determining, by an endpointing module implemented in the WFST accelerator that identifies an endpoint in the speech data, that the first frame of the speech data includes silence data;
   incrementing, by the endpointing module, a silence counter associated with the first state, the silence counter being stored in an active state list within local memory of the WFST accelerator, wherein the active state list associates the first state with a second state, the second state representing a second frame of speech data different from the first frame of speech data represented by the first state;
   copying, by the endpointing module, a value of the silence counter of the first state to a corresponding silence counter field in the second state;
   determining, by the WFST accelerator, that the value of the silence counter for the first state is above a silence threshold, which indicates that a pause in speech has extended longer than a predetermined amount of time;
   in response to determining that the silence counter is above the silence threshold, determining, by the WFST accelerator, that an endpoint of the speech has occurred; and
   outputting, by the WFST accelerator, text data representing a plurality of words determined from the speech data that was received prior to the endpoint.

2. The method of claim 1, wherein the first state stored in the active state list is further associated with an output word state score, the output word state score representing a likelihood that a most recent state having an output word prior to the first state exists in the speech, and a final mark representing a likelihood that the most recent state is an end of speech.

3. The method of claim 2, wherein the final mark is either a positive value or a null value that is determined according to a final mark threshold, wherein the positive value indicates that the most recent state has a probability of being the end of the speech that is above the final mark threshold, and wherein the null value indicates that the most recent state has a probability of being the end of the speech that is below the final mark threshold, the final mark threshold being a probability value that distinguishes between a probability value for a word that is able to be the end of the speech and a probability value for a word that is unable to be the end of the speech.

4. The method of claim 2, wherein determining that the endpoint of the speech has occurred further includes:
   determining that the state score is above a state score threshold value, the state score threshold value delineates a first plurality of words that have a high likelihood of existing in the speech data from a second plurality of words that have a low likelihood of existing in the speech data; and
   determining that the final mark is set to positive.

5. An automatic speech recognition device for tracking end of speech, the automatic speech recognition device comprising:
   a memory device storing a weighted finite state transducer (WFST) language model that includes information about relationships between a sound and a corresponding word of a spoken language;
   a WFST accelerator implemented as a hardware component and comprising local memory, a first module, and a second module, wherein:
      the first module receives first data for a first state associated with a first frame of speech data from the WFST language model, the first data including a silence bit that indicates whether the first frame of the speech data includes audio data or silence data;
      the second module:
         determines that the first frame includes silence data; and
         increments a first counter value associated with the first state; and
      the WFST accelerator:
         determines that the first counter value is above a first threshold, wherein the first threshold is indicative of a predetermined amount of time that differentiates between a pause in speech and the end of speech; and
         determines that an endpoint of the speech has occurred; and
   a natural language understanding (NLU) module that receives a plurality of words determined from the speech data that was received prior to the endpoint from the WFST accelerator and determines an intent using the plurality of words.

6. The automatic speech recognition device of claim 5, wherein the fetch module is further configured to:
   determine that a silence bit in identification data for a second state indicates that the frame of speech data includes audio data; and
   reset the first counter value to 0 in response to the determination that the silence bit in the identification data for the second state indicates that the frame of speech data includes audio data.

7. The automatic speech recognition device of claim 5, wherein an active state list associates the first state with a second state representing a subsequent frame of speech data.

8. The automatic speech recognition device of claim 7, wherein the endpointing module copies the first counter value of the first state to a corresponding first counter value field in the second state upon a determination that the silence bit in the identification data for the first state indicates that the frame of speech data includes silence data.

9. The automatic speech recognition device of claim 5, wherein the first state stored in an active state list is further associated with an output word state score, the output word state score representing a likelihood that a most recent state having an output word prior to the first state exists in the speech, and a final mark representing a likelihood that the most recent state is an end of speech.

10. The automatic speech recognition device of claim 9, wherein the final mark is either a positive value or a null value that is determined according to a final mark threshold, wherein the positive value indicates that the most recent state has a probability of being the end of the speech that is above the final mark threshold, and wherein the null value indicates that the most recent state has a probability of being the end of the speech that is below the final mark threshold.

11. The automatic speech recognition device of claim 9, wherein determining that the endpoint of the speech has occurred further includes:
  determining that the output word state score is above a state score threshold value, the state score threshold value delineates a first plurality of words that have a high likelihood of existing in the speech data from a second plurality of words that have a low likelihood of existing in the speech data; and
  determining that the final mark is set to positive.

12. The automatic speech recognition device of claim 10, wherein the final mark threshold is a probability value that distinguishes between a probability value for a word that is able to be the end of the speech and a probability value for a word that is unable to be the end of the speech.

13. The automatic speech recognition device of claim 9, wherein the output word state score is determined by adding together word scores of the plurality of words.

14. An automatic speech recognition system for tracking end of speech, the automatic speech recognition system comprising:
  an input/output (I/O) device interface coupled to:
    a microphone configured to receive speech input and convert it into speech data that is a digital representation of the speech input;
    an antenna configured to couple the I/O device interface to a server through a network; and
    a speaker configured to output sound to a user;
  a memory device storing a weighted finite state transducer (WFST) language model that includes information about relationships between a sound and a corresponding word of a spoken language;
  an audio processor coupled to the I/O device interface and configured to segment the speech data into frames;
  a WFST accelerator implemented as a hardware component and comprising local memory, a first module, and a second module, wherein:
    the first module receives first data for a first state associated with a first frame of speech data from the WFST language model, the first data including a silence bit that indicates whether the first frame of the speech data includes audio data or silence data;
    the second module:
      determines that the first frame includes silence data; and
      increments a first counter value associated with the first state; and
    the WFST accelerator:
      determines that the first counter value is above a first threshold, wherein the first threshold is indicative of a predetermined amount of time that differentiates between a pause in speech and the end of speech; and
      determines that an endpoint of the speech has occurred; and
  a natural language understanding (NLU) module that receives a plurality of words determined from the speech data that was received prior to the endpoint from the WFST accelerator and determines an intent using the plurality of words.

15. The automatic speech recognition system of claim 14, wherein the fetch module is further configured to:
  determine that a silence bit in identification data for a second state indicates that the frame of speech data includes audio data; and
  reset the first counter value to 0 in response to the determination that the silence bit in the input label for the second state indicates that the frame of speech data includes audio data.

16. The automatic speech recognition system of claim 14, wherein the first state stored in an active state list is further associated with an output word state score, the output word state score representing a likelihood that a most recent state having an output word prior to the first state exists in the speech, and a final mark representing a likelihood that the most recent state is an end of speech.

17. The automatic speech recognition system of claim 16, wherein the final mark is either a positive value or a null value that is determined according to a final mark threshold, wherein the positive value indicates that the most recent state has a probability of being the end of the speech that is above the final mark threshold, and wherein the null value indicates that the most recent state has a probability of being the end of the speech that is below the final mark threshold.

18. The automatic speech recognition system of claim 17, wherein determining that the endpoint of the speech has occurred further includes:
  determining that the state score is above a state score threshold value, the state score threshold value delineates a first plurality of words that have a high likelihood of existing in the speech data from a second plurality of words that have a low likelihood of existing in the speech data; and
  determining that the final mark is set to positive.

19. The automatic speech recognition system of claim 17, wherein the final mark threshold is a probability value that distinguishes between a probability value for a word that is able to be the end of the speech and a probability value for a word that is unable to be the end of the speech.

20. The automatic speech recognition system of claim 16, wherein the output word state score is determined by adding together word scores of the plurality of words.

\* \* \* \* \*